US009191021B1

(12) United States Patent
Sui et al.

(10) Patent No.: US 9,191,021 B1
(45) Date of Patent: Nov. 17, 2015

(54) ANALOG-TO-DIGITAL CONVERTER WITH CONTROLLED ERROR CALIBRATION

(71) Applicants: Zhiling Sui, Suzhou (CN); Zhijun Chen, Suzhou (CN); Zhihong Cheng, Suzhou (CN); Yanping Zhang, Suzhou (CN)

(72) Inventors: Zhiling Sui, Suzhou (CN); Zhijun Chen, Suzhou (CN); Zhihong Cheng, Suzhou (CN); Yanping Zhang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/696,482

(22) Filed: Apr. 26, 2015

(30) Foreign Application Priority Data

Dec. 12, 2014 (CN) .......................... 2014 1 0858266

(51) Int. Cl.
| | |
|---|---|
| *H03M 1/10* | (2006.01) |
| *H03M 1/12* | (2006.01) |
| *H03M 1/42* | (2006.01) |
| *H03M 1/44* | (2006.01) |

(52) U.S. Cl.
CPC .............. *H03M 1/1009* (2013.01); *H03M 1/12* (2013.01); *H03M 1/42* (2013.01); *H03M 1/44* (2013.01)

(58) Field of Classification Search
CPC ....... H03M 1/1009; H03M 1/12; H03M 1/42; H03M 1/44
USPC .......................................... 341/120, 155, 161
See application file for complete search history.

(56) References Cited

U.S. PATENT DOCUMENTS

| | | | |
|---|---|---|---|
| 7,312,734 B2 | 12/2007 | McNeill et al. | |
| 7,786,910 B2 | 8/2010 | Ali et al. | |
| 7,898,446 B2 | 3/2011 | Nagarajan et al. | |
| 7,932,846 B2 | 4/2011 | Imai | |
| 7,940,199 B2 | 5/2011 | Chen et al. | |

(Continued)

OTHER PUBLICATIONS

Nan Sun and Donhee Ham, "Digital Acceleration of Correlation-Based Digital Background Calibration in Pipelined ADCs", Harvard Technical Report, 2008.

(Continued)

*Primary Examiner* — Brian Young
(74) *Attorney, Agent, or Firm* — Charles Bergere

(57) ABSTRACT

A pipelined analog-to-digital converter (ADC) that converts an analog input voltage signal $V_{in}$ into a digital output value $D_{out}$. The ADC has a sequence of stages including a first calibrated stage having: (1) an ADC sub-module that receives $V_{in}$ and provides an ADC sub-module digital output value based on $V_{in}$, (2) a DAC sub-module that receives the ADC sub-module digital output value and outputs a corresponding analog voltage signal $V_{DAC}$, (3) a first difference module that generates an analog residual-voltage signal based on a difference between $V_{in}$ and $V_{DAC}$, and (4) an artificial-noise-insertion module that inserts an analog artificial-noise voltage signal into the residual voltage signal to generate an analog combined voltage signal. The analog combined voltage signal is used to calibrate the first calibrated stage. The artificial-noise-insertion module generates the polarity of the artificial-noise voltage signal based on the polarity of the corresponding residual voltage signal.

20 Claims, 8 Drawing Sheets

(56) References Cited

U.S. PATENT DOCUMENTS

| | | | |
|---|---|---|---|
| 7,952,502 B2 | 5/2011 | Kolze et al. | |
| 8,040,263 B2 | 10/2011 | Nakajima | |
| 8,106,805 B2 * | 1/2012 | Lin | H03M 1/0604 341/120 |
| 8,344,920 B1 | 1/2013 | Hernes | |
| 8,390,489 B2 * | 3/2013 | Sun | H03M 1/1014 341/120 |
| 8,421,658 B1 * | 4/2013 | Yau | H03M 1/1004 341/118 |
| 8,451,152 B2 | 5/2013 | Shi et al. | |
| 8,451,154 B2 * | 5/2013 | Erdmann | H03M 1/1057 341/118 |
| 8,482,445 B1 | 7/2013 | Harris | |
| 8,502,714 B2 | 8/2013 | Chen et al. | |
| 9,136,856 B1 * | 9/2015 | El-Chammas | H03M 1/1023 |

OTHER PUBLICATIONS

J. Li and U. Moon, "Background Calibration Techniques for Multistage Pipelined ADCs with Digital Redundancy", IEEE Trans. Circuits Syst. II, Analog Digital Signal Processing, vol. 50, No. 9, Sep. 2003, pp. 531-538.

J. McNeill, M. Coln, and B. Larivee, "Split-ADC Architecture for Deterministic Digital Background Calibration of a 16b 1 MS/s ADC", IEEE International Solid-State Circuits Conference (ISSCC) Digital Technical Papers, vol. 1, 2005, pp. 276-298.

Jipeng Li, G-C. Ahn, D-Y. Chang, and U. Moon, "A 0.9-V 12-mW 5-MSPS Algorithmic ADC with 77-dB SFDR", IEEE Journal of Solid-State Circuits, vol. 40, No. 4, pp. 960-969, Apr. 2005.

Yun-Shiang Shu, and Bang-Sup Song, "A 15-bit Linear 20-MS/s Pipelined ADC Digitally Calibrated With Signal-Dependent Dithering", IEEE Journal of Solid-State Circuits, vol. 43, No. 2, Feb. 2008.

Imran Ahmed and David A. Johns, "An 11-Bit 45 MS/s Pipelined ADC With Rapid Calibration of DAC Errors in a Multibit Pipeline Stage", IEEE Journal of Solid-State Circuits, vol. 43, No. 7, Jul. 2008.

John McNeill, Michael C. W. Coln, and Brian J. Larivee, ""Split ADC" Architecture for Deterministic Digital Background Calibration of a 16-bit 1-MS/s ADC", IEEE Journal of Solid-State Circuits, vol. 40, No. 12, Dec. 2005.

* cited by examiner

| Value | 0 (+, -) | 1 (-, +) | 1 (-, +) | 1 (-, +) | 1 (-, +) | 1 (-, +) |
|---|---|---|---|---|---|---|
| R[n] | + | - | - | + | + | + |
| 312a*308a | + | + | + | - | - | + |
| 312a | + | - | + | + | - | + |
| 308a | + | - | - | + | - | + |

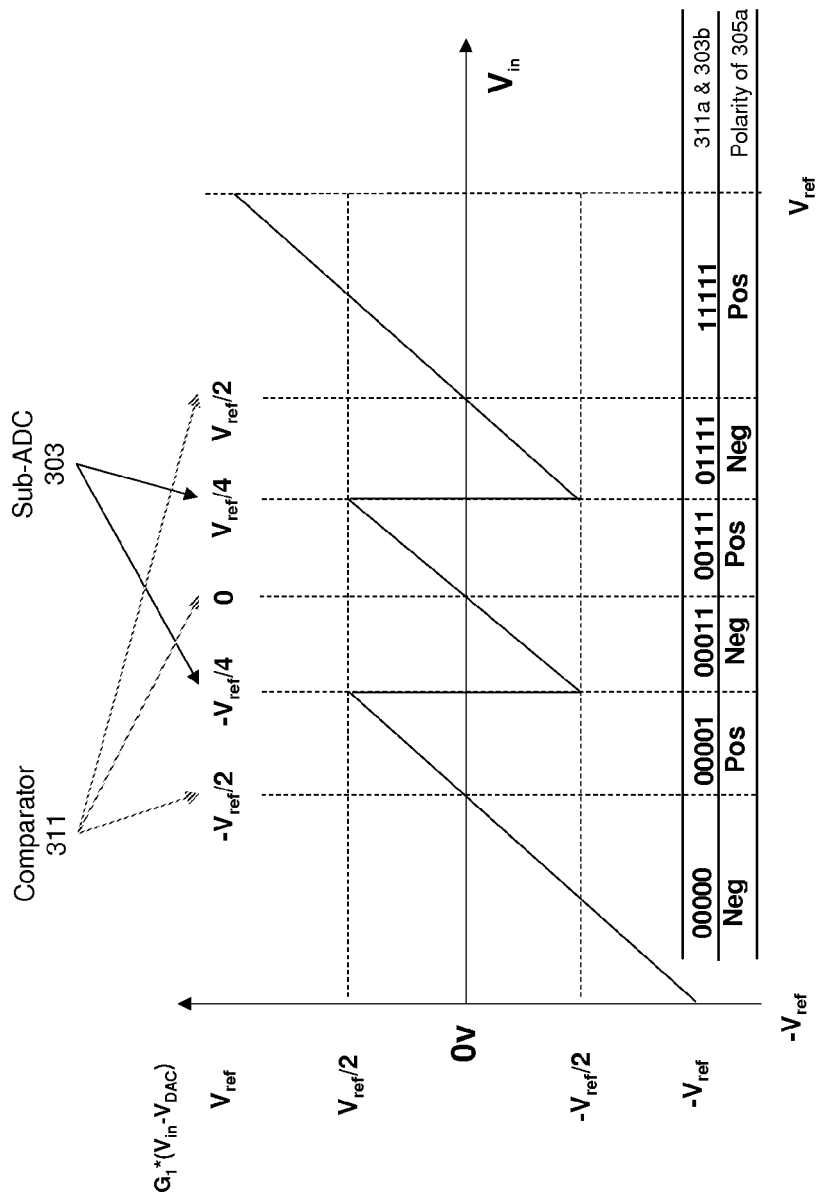

ANALOG-TO-DIGITAL CONVERTER WITH CONTROLLED ERROR CALIBRATION

BACKGROUND OF THE INVENTION

The present invention relates to analog-to-digital converters (ADCs), and more particularly, to gain error calibration in pipelined ADCs.

ADCs convert the amplitude of an analog input voltage signal to a corresponding digital output value for processing by a digital circuit. One of the simplest conventional ADCs is the flash, or direct-conversion, ADC. A flash ADC uses a linear array of comparators to compare the input voltage to a series of reference voltage values—conventionally generated using a voltage ladder—and generate a digital value based on the results of the comparisons. Flash ADCs are among the fastest ADCs. However, increasing the output precision of a flash ADC exponentially increases the number of comparators needed and, consequently, greatly increases the production and usage costs of the flash ADC. As a result, other types of ADCs that are less costly have been developed. One such type of ADC is a pipelined ADC, which is also known as a subranging quantizer.

A pipelined ADC comprises a connected series of stages. The pipelining through the stages allows for a high throughput rate but does generate some data latency. Each stage generates a digital value corresponding to a portion of the digital output value. In addition, each stage, other than the final stage, provides an analog residual signal—representing the difference between (a) the analog signal received by the stage from upstream and (b) an analog signal corresponding to the portion of the digital output value generated by the stage—to the next stage. The digital values generated by the different stages, including the last stage, are processed by a time-alignment and error correction circuit to generate the digital output value representing the original analog input signal applied to the pipelined ADC. The time alignment is performed because each analog sample is processed by a different stage at a different time.

FIG. 1 is a simplified schematic diagram of a conventional pipelined ADC 100, which receives an analog input signal $V_{in}$ and generates a digital output signal $D_{out}$ representing the magnitude of the analog input signal $V_{in}$. The ADC 100 comprises N stages 101(1)-101(N). Each stage 101, other than the last stage 101(N), operates in substantially the same way.

The first stage 101(1) receives the analog input signal $V_{in}$ as the input 101a(1) and outputs (a) a first digital value $D_1$ to the summation module 102 via the data path 103a(1) and (b) an analog remainder signal 101b(1) to the second stage 101(2). The first output value $D_1$ represents the one or more most-significant bits of the digital output value $D_{out}$. Successive stages output digital values $D_i$ representing progressively less-significant bits with the last stage 101(N) outputting an Nth digital value $D_N$ representing the one or more least-significant bits. The summation module 102 stores, correlates, and sums the N digital values $D_1$-$D_N$ provided by the N stages 101 to provide, via the output path 102a, the digital output value $D_{out}$.

In general, the stage 101(i), where i is an integer from 1 to N−1, receives the analog input signal 101a(i), which is provided to the sample-and-hold (S&H) module 104. The S&H module 104 intermittently samples and holds the signal 101a(i) and provides the held output signal 104a to the ADC sub-module 103 and the difference module 105. The ADC sub-module 103 may be a low-resolution flash ADC device, such as, for example, a 3-bit flash ADC. The ADC sub-module 103 outputs the digital output value $D_i$ to the summation module 102 and to the DAC sub-module 106 via the data path 103a(i).

The DAC sub-module 106 converts the digital output value $D_i$ of the data path 103a into an analog signal for provision as the signal 106a to the difference module 105. The difference module 105 subtracts the analog signal 106a from the held input signal 104a and generates the corresponding remainder signal 105a. The remainder signal 105a is provided to amplifier 107, which multiplies the remainder signal 105a by gain G to generate the residual signal 101b(i), which is provided to the next stage 101(i+1) as the input 101a(i+1) of that next stage 101(i+1). Consequently, the input signal 101a(N), for example, corresponds to the output signal 101b(N−1). The final stage 101(N) does not output a residual signal and does not need any components other than the S&H module 104 and the ADC sub-module 103.

A conventional pipelined ADC may also include calibration circuitry to offset gain errors that may be caused by, for example, capacitor mismatches, limited op-amp gains, and environmental variations. Performing calibration in the background allows for correction that dynamically accounts for variations without interrupting the analog-to-digital conversion.

One conventional calibration method is known as correlation-based background calibration. This method involves adding known random-like noise samples to a stage's remainder signal, which is then amplified by the amplifier in the stage and processed by the following stages (back-end ADC) along with the remainder signal. Random-like samples may be generated by a random-number generator that outputs random or pseudo-random numbers. Since the values of the random-like samples are known, (a) they can be accurately extracted from the ADC's output signal and (b) the effect of gain errors on the samples may be analyzed to determine gain error parameters for the ADC.

FIG. 2 is a simplified schematic diagram of a conventional pipelined ADC 200 that includes background calibration circuitry. Components of the ADC 200 that are similarly labeled but with a different prefix are—unless otherwise indicated—substantially the same as the corresponding elements of the ADC 100 of FIG. 1. Typically, only the first few stages 201 include calibration circuitry. Background calibration is typically performed in reverse order so that if, for example, the stages 201(1)-201(3) include calibration circuitry, then the third stage 201(3) is calibrated first, then the second stage 201(2), and then the first stage 201(1).

Each stage 201 that includes calibration circuitry comprises a random-number (RN) generator 208, a calibration DAC 209, and a difference module 210. Furthermore, the summation and calibration module 202 includes additional circuitry (not shown) for cancelling out the artificial noise signal inserted by the calibration circuitry. The RN generator 208 generates a random-like sequence of digital values whose average (mean) value is zero. These digital values are provided to the calibration DAC 209 via the signal path 208a and converted to analog signals, which are in turn provided to the difference module 210 via the signal path 209a. The difference module 210 subtracts the artificial noise signal 209a from the remainder signal 205a to generate the analog signal 210a, which is in turn provided to the amplifier 207. The amplifier 207 amplifies the analog signal 210a by gain factor G and outputs the residual signal 201b(i) to the next stage 201(i+1). The random-like noise inserted by the RN generator 208 and the DAC 209 is subsequently analyzed by the summation and calibration module 202 to estimate the gain error of the amplifier 207.

Conventional correlation-based background calibration is slow to converge on error-parameter values, sometimes requiring millions of clock cycles to sufficiently converge. Some faster systems utilize additional hardware and still require many thousands of clock cycles to sufficiently converge.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

FIG. 5 is an exemplary graph of the relation between $V_{in}$ and $G_1*(V_{in}-V_{DAC})$ in the ADC of FIG. 3;

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

Figure 2:
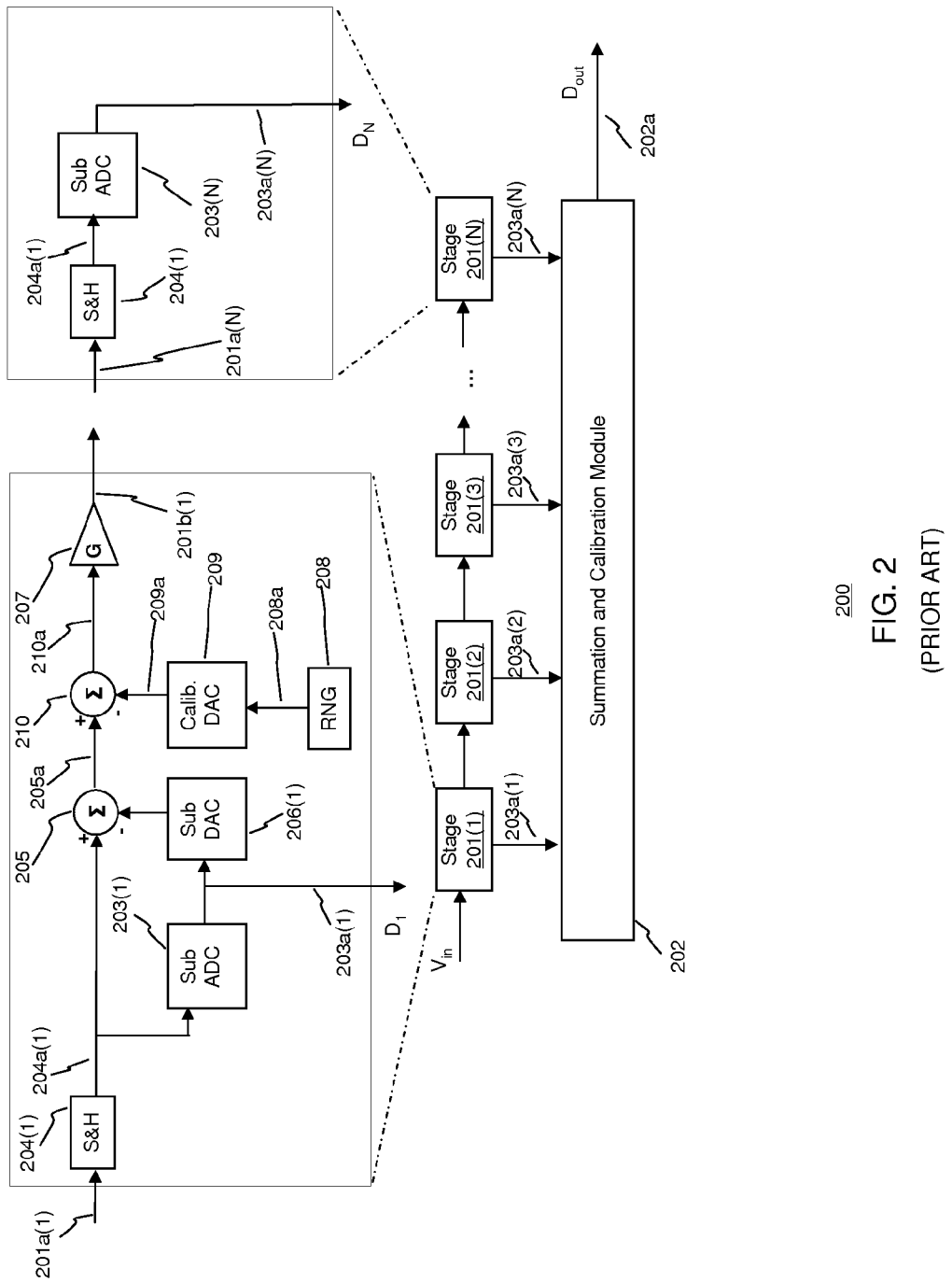
FIG. 2 is a simplified schematic diagram of a conventional pipelined ADC that includes gain error background calibration circuitry.
Figure 3:
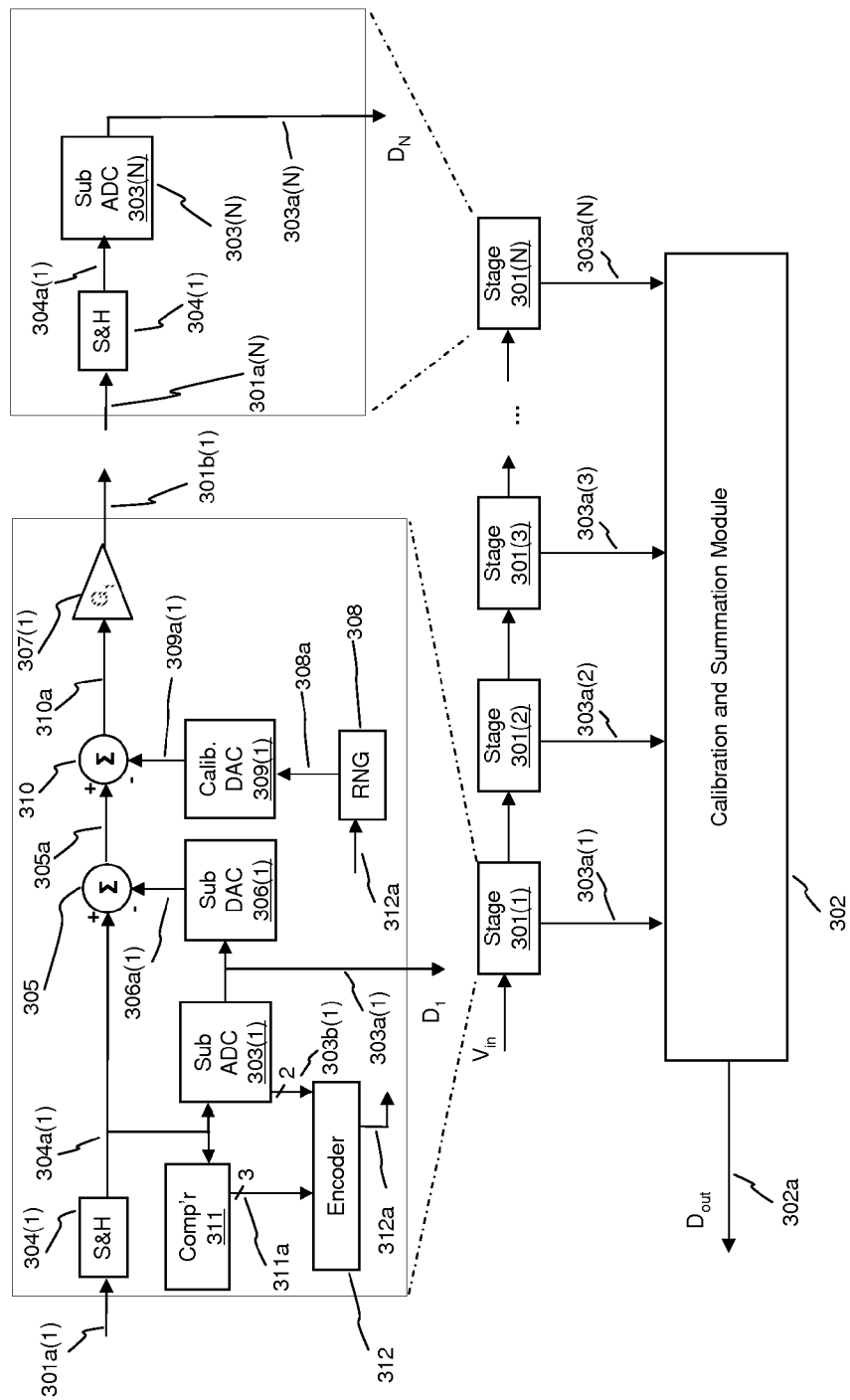
FIG. 3 is a simplified schematic diagram of a pipelined ADC with gain error background calibration in accordance with an embodiment of the present invention.

FIG. 3 is a simplified schematic diagram of a pipelined ADC 300 with background calibration in accordance with an embodiment of the present invention. Components of the ADC 200 that are similarly labeled but with a different prefix are—unless otherwise indicated—substantially the same as the corresponding elements of the ADC 200 of FIG. 2.

The ADC 300 comprises N stages 301(1)-301(N). Note that, unless otherwise indicated, the use of a parenthetical suffix to identify elements of the figures is intended as shorthand to identify the corresponding stage. For example, the ADC sub-module 303(1) refers to the ADC sub-module 303 of the stage 301(1).

Figure 1:
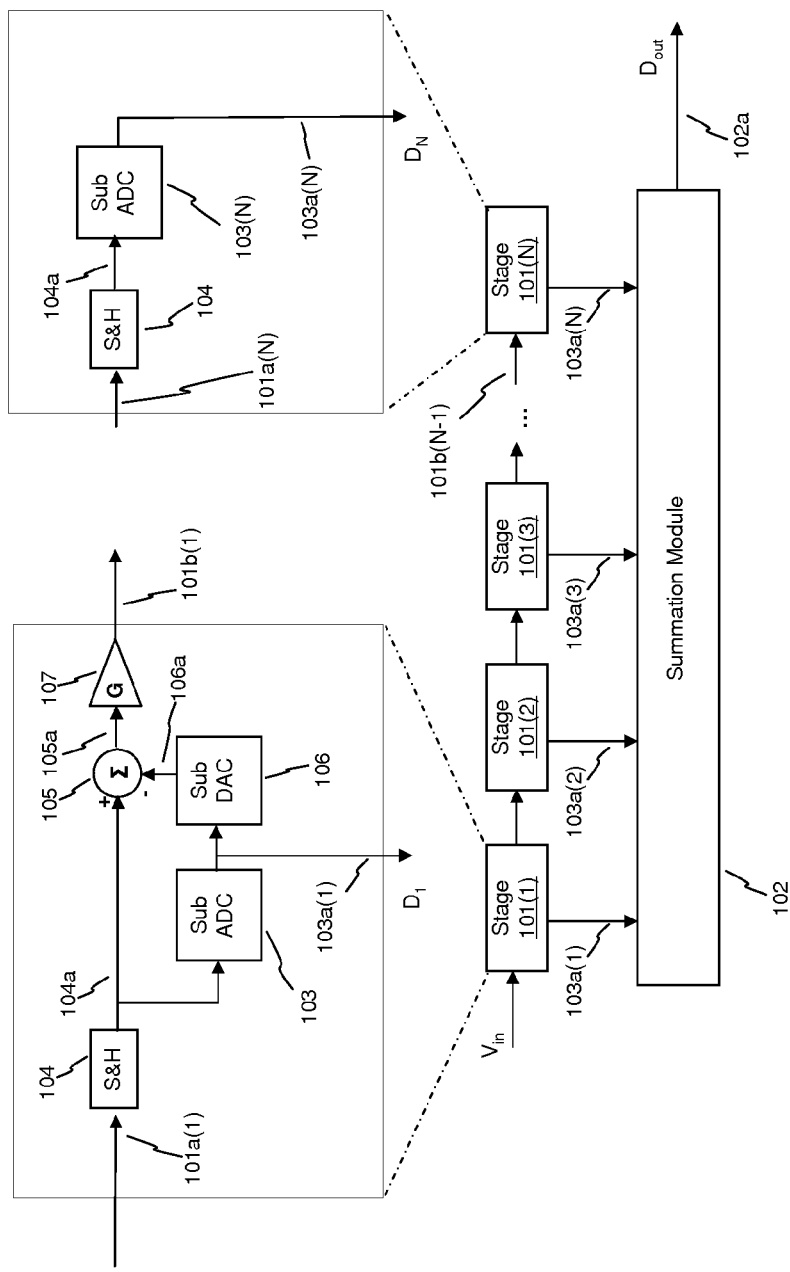
FIG. 1 is a simplified schematic diagram of a conventional pipelined ADC.

The analog-to-digital conversion of the ADC 300 works substantially the same as in the ADC 100 of FIG. 1 and the ADC 200 of FIG. 2. The calibration circuitry of the ADC 300 comprises additional circuitry and uses different logic in comparison to the calibration circuitry of the ADC 200 of FIG. 2. Rather than providing a simple zero-averaged random-like sequence, the RN generator 308 of FIG. 3 provides a controlled zero-averaged random-like sequence whose values depend on both a random-number generator and the polarity of the analog residual signal. As noted above, the random-like values are used to insert artificial noise that is subsequently analyzed and removed in the calibration and summation module 302. The operation of the ADC 300 is explained in further detail, below.

The stage 301(1) is one of one or more calibrated stages of the ADC 300. As noted above, in typical operation, if multiple stages are calibrated, then they are sequentially calibrated in reverse order. The stage 301(1) comprises an S&H module 304(1), a ADC sub-module 303(1), a DAC sub-module 306(1), difference modules 305 and 310, a comparator module 311, an encoder 312, an RN generator 308, a calibration DAC 309(1), and an amplifier 307(1).

The stage 301(1) receives via the input 301a(1) the analog voltage $V_{in}$, which is sampled and held by the S&H module 304(1). For the duration of the sample period, the S&H module 304(1) provides the held voltage signal 304a(1) to (a) the ADC sub-module 303(1), (b) the difference module 305, and (c) the comparator module 311.

Figures 4, 6:
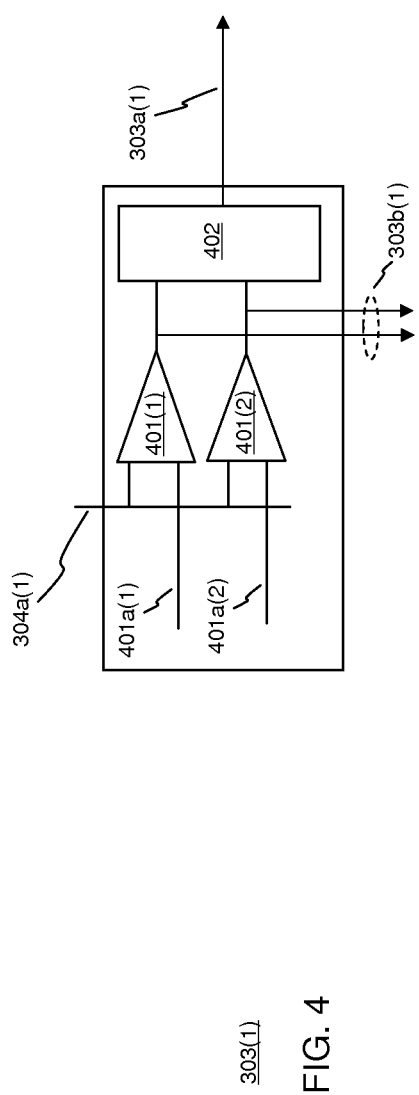
FIG. 4 is a simplified schematic diagram of the ADC sub-module of FIG. 3.
FIG. 6 is a table of exemplary values of various signals for 8 samples processed by a stage in the ADC of FIG. 3.

FIG. 4 is a simplified schematic diagram of the ADC sub-module 303(1) of FIG. 3. The ADC sub-module 303(1) comprises two comparators 401(1)-401(2) and an encoder 402, making the resolution of the stage 301(1) 1.5 bits. The two comparators 401 compare $V_{in}$—as represented by the held signal 304a(1)—to two voltages on respective inputs 401a(1) and 401a(2): $-V_{ref}/4$ and $V_{ref}/4$, where $V_{ref}$ is a reference voltage representing a maximum expected input voltage $V_{in}$. Depending on the outputs of the comparators 401, the encoder 402 outputs an encoded 2-bit value $D_1$ via the path 303a(1) to (a) the DAC sub-module 306(1) of FIG. 3 and (b) the calibration and summation module 302 of FIG. A. The ADC sub-module 303(1) further outputs the raw outputs of its comparators 401 to the encoder 312 of FIG. 3 via the path 303b(1).

The DAC sub-module 306(1) converts the digital value $D_1$ to an analog voltage that is output to the difference module 305 via the signal 306a(1). The difference module 305 subtracts the signal 306a(1)—which is referred to as $V_{DAC}$—from the held signal 304a(1).

The comparator module 311 comprises three comparators (not shown). Note that the number of comparators c in the comparator module 311 is related to the resolution r of the ADC sub-module 303(1) by the equation $c=2^{(r+0.5)}-1$. The three comparators of the comparator module 311 compare $V_{in}$, as represented by the held signal 304a(1), to (a) $-V_{ref}/2$, (b) 0, and (c) $V_{ref}/2$. The raw outputs of the comparators of the comparator module 311 are provided to the encoder 312 via the data path 311a. The encoder 312 uses the inputs 311a and 303b(1) to determine the polarity of $V_{in}-V_{DAC}$, which is equivalent to the polarity of the signal 305a. The encoder 312 outputs the determined polarity via data path 312a, which is provided to the RN generator 308. In one implementation, a negative polarity is encoded as a 0, and a positive polarity is encoded as a 1.

FIG. 5 is an exemplary graph 500 of the relation between $V_{in}$ and $G_1*(V_{in}-V_{DAC})$ in the ADC 300 of FIG. 3, where $G_1$ is the gain of the amplifier 307(1), with the addition of information to illustrate the relationship between the polarity of the signal 305a (equivalent to $V_{in}-V_{DAC}$) and the comparison voltages used by the ADC sub-module 303(1) and the comparator module 311. Specifically:

(a) if $V_{in}<-V_{ref}/2$, then the polarity of the signal 305a is negative, (b) if $-V_{ref}/2<V_{in}<-V_{ref}/4$, then the polarity of the signal 305a is positive, (c) if $-V_{ref}/4<V_{in}<0$, then the polarity of the signal 305a is negative, (d) if $0<V_{in}<V_{ref}/4$, then the polarity of the signal 305a is positive, (e) if $V_{ref}/4<V_{in}<V_{ref}/2$, then the polarity of the signal 305a is negative, and (f) if $V_{ref}/2<V_{in}$, then the polarity of the signal 305a is positive.

Note that, in the graph 500, the sum of the values on the data paths 311a and 303b(1) is a thermometer-code sum, which shows, in thermometer code, the total number of comparators outputting a positive output. As shown, the sequential thermometer codes from 00000 to 11111 correspond to the ranges (a)-(f) above.

The RN generator 308 generates a random or pseudo-random bit R[n] at half the operating frequency of the stage 301. Each value of R[n] represents a desired 2-cycle polarity sequence for the product of the polarities encoded by the signals 308a and 312a and is used to determine the polarity encoded on data path 308a. Specifically, (a) if R[n] is 0 for a 2-cycle period, then the polarities for the product 308a*312a for the two cycles should be positive and then negative and (b) if R[n] is 1 for a 2-cycle period, then the polarities for the product 308a*312a for the two cycles should be negative and then positive. Note that, in alternative embodiments, the order may be reversed, where if R[n] is 0 then the polarities would be negative and then positive and if R[n] is 1, then the polarities would be positive and then negative. The values on the data path 308a are then selected so that the desired polarities are achieved. Thus, for a particular sampled input voltage $V_{in}$:

(a) if the desired polarity of 308a*312a is positive and the value on the data path 312a is positive, then the value on the data path 308a will be positive;

(b) if the desired polarity of 308a*312a is positive and the value on the data path 312a is negative, then the value on the data path 308a will be negative;

(c) if the desired polarity of 308a*312a is negative and the value on the data path 312a is positive, then the value on the data path 308a will be negative; and (d) if the desired polarity of 308a*312a is negative and the value on the data path 312a is negative, then the value on the data path 308a will be positive.

This ensures that the polarity of every pair of values of the product 312a*308a alternates, which helps to speed up the convergence of the calibration for the stage 301.

FIG. 6 is a table 600 of exemplary values on select data paths for eight samples processed by the stage 301(1) of FIG. 3. The table 600 shows a sequence of four values of R[n], the resultant desired polarities for 312a*308a, the determined polarities of the difference $V_{in}-V_{DAC}$ as indicated by the value on the data path 312a, and the consequent polarities of the value on the data path 308a from the RN generator 308.

Based on value on the data path 308a, the calibration DAC 309(1) outputs $+S_1$ or $-S_1$ via the signal 309a(1) to the difference module 310, where $S_1$ is a scalar voltage level whose absolute value is less than the input range of the ADC 300. Note that the RN generator 308, the calibration DAC 309, and the difference module 310 work together to generate and insert artificial noise into the residual voltage signal of the stage and together may be considered to be an artificial-noise-insertion module. In some implementations, $S_1$ is not more than 5% of the voltage input range of the ADC 300.

The difference module 310 subtracts the signal 309a(1) from the signal 305a to generate the signal 310a, which, in turn, is provided to the amplifier 307(1). The amplifier 307(1) has a nominal gain of $G_1$ and outputs $G_1*$(the signal 310a) as the signal 301b(1), which is provided to the next stage 301(2). Note that $G_1$ may be 2 for a 1.5-bit stage, 4 for a 2.5-bit stage, and 8 for a 3.5-bit stage. Note that the amplifier 307(1) has a real error factor of $e_1$ and, as a result, the actual gain of the amplifier 307(1) is $G_1(1+e_1)$. One purpose of the calibration is to determine the value of $e_1$ by observing how the known artificial-noise samples generated by the calibration DAC 309(1) are actually amplified by the amplifier 307(1).

When the stage 301(1) is being calibrated, the stages 301(2)-301(N) may be considered a back-end ADC with a resolution of $Re_1$, which is based on the number N, the resolutions of the individual stages 301(2)-301(N), and how their outputs are added together by the calibration and summation module 302. In one implementation, the resolution $Re_i$ for the back-end ADC for stage 301(i) may be calculated as $Re_i=1+T-(N-i+1)*(0.5)$, where T is the sum of the resolutions of the stages of the back-end ADC, i.e., stages 301(i+1)-301(N). The data paths 303a from the stages 301(2)-301(N) are also provided to the calibration and summation module 302, which adds appropriate delays to the received input values, offsets the inserted random-like calibration values, offsets the amplifications of the corresponding amplifiers 307, and sums the processed values to generate the digital output value $D_{out}$ via the data path 302a.

Figure 7:
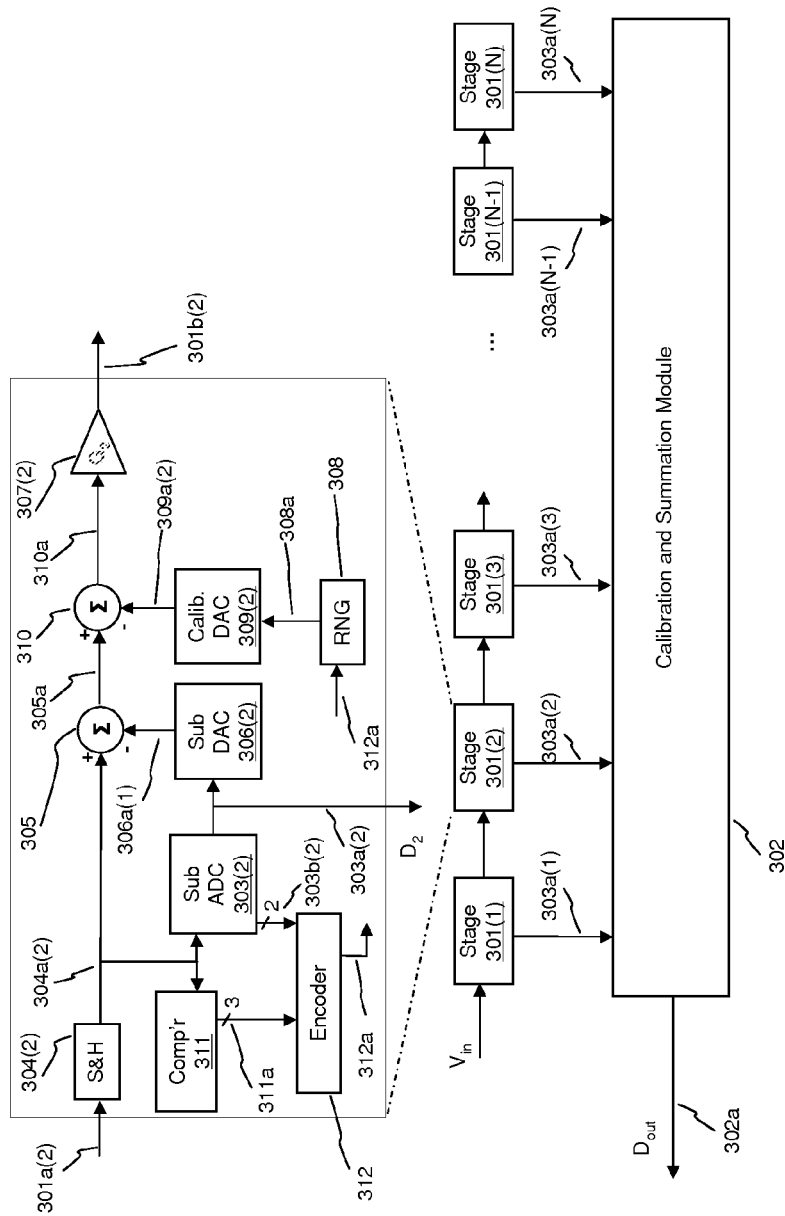
FIG. 7 is a simplified schematic diagram of one implementation of the pipelined ADC of FIG. 3, where a second stage also comprises calibrating circuitry.

FIG. 7 is a simplified schematic diagram of one implementation of the pipelined ADC 300 of FIG. 3, where the second stage 301(2) also comprises calibration circuitry. The second stage 301(2) receives input signal 301a(2) from the first stage 301(1) and proceeds to process it in substantially the same way as described above in reference to the first stage 301(1) and outputs (a) the digital value $D_2$ via the data path 303a(2) and (b) the residual voltage signal 301b(2) to the next stage 301(3). Note that (a) the gain of the amplifier 307(2) is $G_2$, which may be different from $G_1$, (b) the error of the amplifier 307(2) is $e_2$, which is independent of $e_1$, (c) the calibration DAC 309(2) uses the scalar voltage level $S_2$, which may be different from $S_1$, and (d) the back-end ADC for stage 301(2) is the stages 301(3)-301(N) and has a resolution of $Re_2$, which is less than $Re_1$. It should be noted that if two stages need calibration, then, initially, the latter stage should be calibrated first and then the earlier stage. After both stages are calibrated, the two stages can be calibrated simultaneously.

Figure 8:
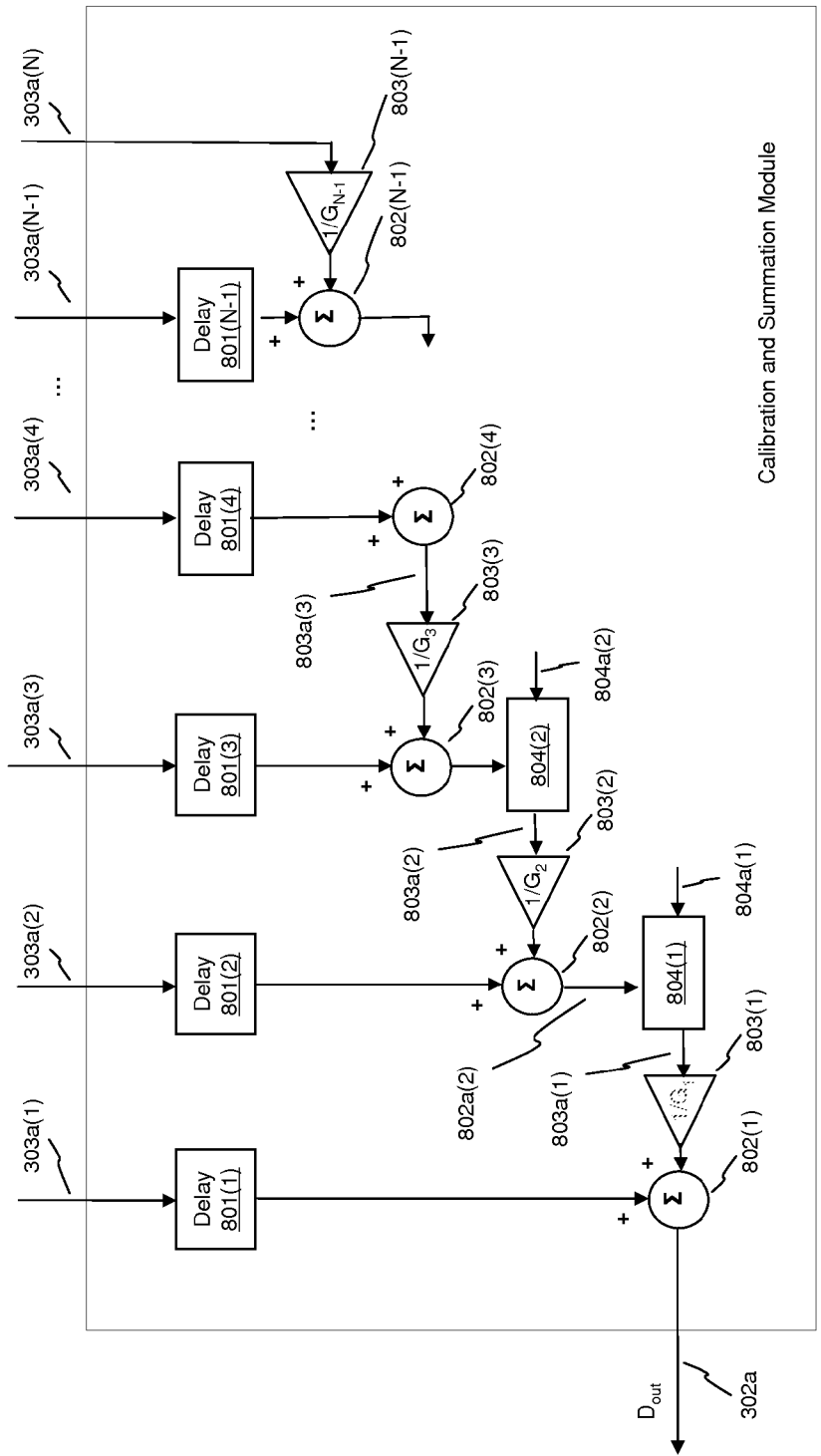
FIG. 8 is a simplified schematic diagram of one implementation of the calibration and summation module of FIG. 7.

FIG. 8 is a simplified schematic diagram of one implementation of the calibration and summation module 302 of and FIG. 7. Each input data path 303a(i) from the corresponding stage 301(i) is delayed by a corresponding delay of N-i clock cycles. The data path 303a(1), for example, is, consequently, delayed N-1 clock cycles. These delays are implemented by the corresponding delay modules 801(i). Since the delay on the input data path 303a(N) is N-N, or zero, clock cycles, there is no delay module 801(N). Each delayed data path 303a(i), for i from 1 to N-1, is provided to a corresponding summing module 802(i), which adds the value on the delayed data path 303a(i) to the output of a corresponding amplifier 803(i). The gain of the amplifier 803(i) is $1/G_i$, where $G_i$ is the nominal gain of the amplifier 307(i) of the stage 301(i) of FIG. 3.

The value on the data path 303a(N) is provided to the amplifier 803(N−1). Each other amplifier 803(i), for i from 1 to N−2, receives its input 803a(i) from either (a) a corresponding calibration circuit 804(i), if the stage 301(i) performs calibration, or (b) a corresponding summation module 802(i+1). Each calibration circuit 804(i) receives (a) an input 802a(i+1) from a corresponding summation module 802(i+1) and (b) an input 804a(i). The value of the input 804a(i) may depend on one or more of (a) $Re_i$, the resolution of the backend ADC for the stage 301(i), (b) $S_i$, the scalar level used by the corresponding calibration DAC 309(i), (c) R[n], the polarity pair determined by the RN generator 308 of the stage 301(i), and (d) $G_i$, the gain of the amplifier 307(i). The value of the input 804a(i) may be the product $Re_i * P(R[n]) * S_i * G_i$, where P(R[n]) is the polarity of the product of the values on the data paths 312a and 308a, as determined by the corresponding value of R[n].

Note that this implementation of the module 302 comprises the calibration circuits 804(1) and 804(2) for the stages 301(1) and 301(2), respectively. The calibration circuit 804(i) (a) calculates a gain error estimate $e_i$ for the corresponding stage 301(i) and (b) offsets the effects of the random-like values inserted by the calibration DAC 309(i).

Figure 9:
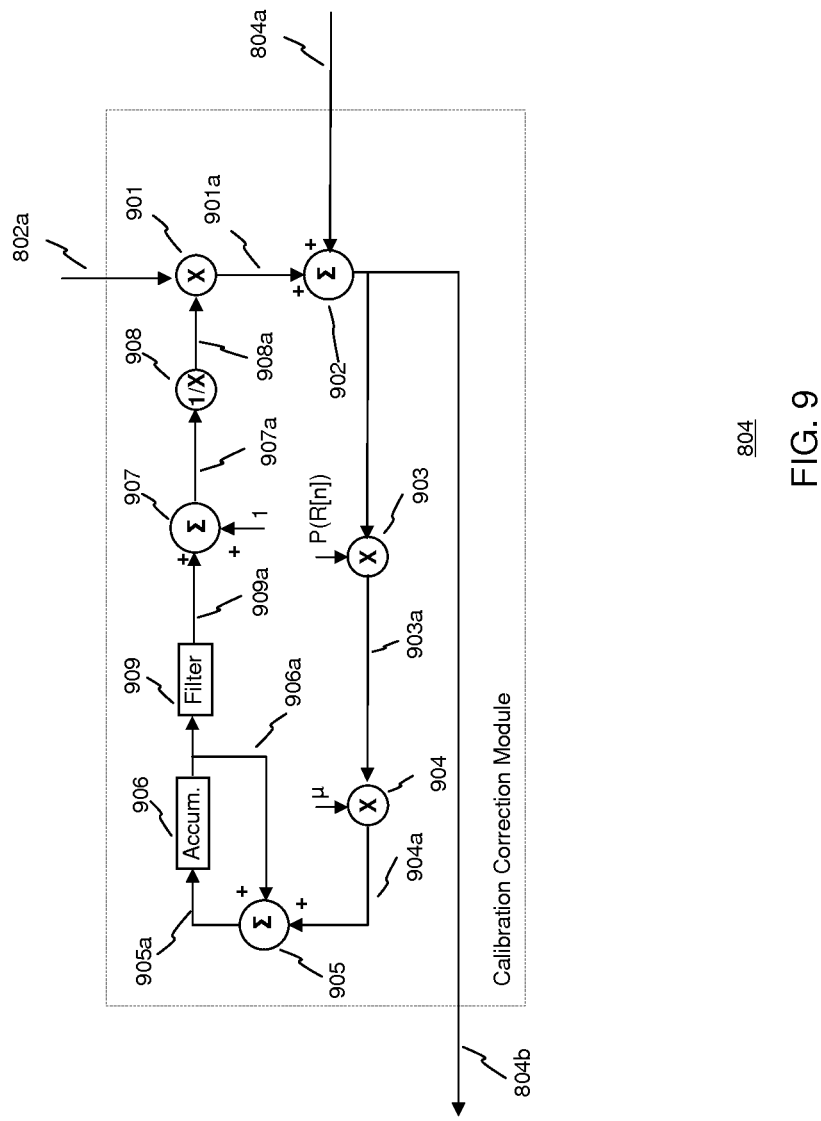
FIG. 9 is a simplified schematic diagram of an exemplary implementation of each calibration circuit of FIG. 8.

FIG. 9 is a simplified schematic diagram of an exemplary implementation of each calibration circuit 804(1) and 804(2) of FIG. 8. The multiplier 901 multiplies the values on the data paths 802a and 908a and provides the product via the data path 901a to the summation module 902, which adds the value on the data path 804a to the value on the data path 901a and outputs the sum 804b. The sum 804b is provided as the output of the calibration circuit 804 and is also provided to the multiplier 903.

The multiplier 903 multiplies the value on the data path 804b by P(R[n]), and the product is then provided to the multiplier 904 via data path 903a. The multiplier 904 multiplies the value on the data path 903a by μ, where μ is a scaling coefficient. In some implementations, μ is between one millionth and one billionth. The multiplier 904 provides the resulting product 904a to the summation module 905. The summation module 905 adds the values on the data paths 904a and 906a and outputs the sum 905a to the accumulator 906. The accumulator 906 is a register that operates together with the summation module 905 in a feedback loop to function as an accumulator. The accumulator holds and outputs the value on the data path 906a to the summation module 905 and a digital filter 909. The digital filter 909 may be a low-pass filter or an average filter. The filter 909 provides output 909a to a summation module 907. The output 909a is an estimate of error e of the corresponding amplifier 307. Over a plurality of cycles, the value of the output 909a converges towards the value of e, which is used to calibrate operation of the ADC. The summation module 907 adds 1 to the output value 909a and provides the sum 907a to the inverse multiplier 908, which outputs the multiplicative inverse 908a to the above-described multiplication module 901.

An embodiment of the invention has been described where the stages 301 of FIG. 3 have a resolution of 1.5 bits, as determined by the number of comparators in the corresponding ADC sub-module 303. The invention, however, is not so limited. In alternative embodiments of the invention, the stages have different resolutions and correspondingly different numbers of comparators in the comparator module 311 and a correspondingly different encoder 312. Embodiments with a higher resolution would have more comparators in the comparator module 311 and correspondingly greater number of inputs to the encoder module 312. Embodiments with a lower resolution would have fewer comparators in the comparator module 311 and correspondingly fewer number of inputs to the encoder module 312. In these alternative embodiments, the ADC sub-module 303 and the comparator module 311 would use correspondingly different sets of comparison voltages to perform their above-described functions.

An embodiment of the invention has been described with particular components of the correction and calibration module 302 of FIG. 3. The invention is not, however, limited to the particular implementation described. In alternative embodiments, the summation module 302 comprises different components, interconnection, and/or logic to (a) correlate the outputs of the plurality of the stages 301, (b) determine gain error of each calibrated stage, and (c) offset the effects of the random-like values inserted by each calibrated stage.

An embodiment of the invention has been described where the determining of the polarity of $V_{in} - V_{DAC}$ is performed by two separate comparator modules, namely the ADC sub-module and the additional comparator module. The invention is not, however, so limited. In alternative embodiments, a different set of components is used to determine the polarity of $V_{in} - V_{DAC}$. For example, in one alternative embodiment, the ADC sub-module is modified to have additional comparators whose outputs are provided to the encoder for determining the polarity of $V_{in} - V_{DAC}$.

An embodiment of an ADC has been described with certain digital values encoded in particular ways. The invention is not, however, so limited. As would be appreciated by a person of ordinary skill in the art, the encodings of particular digital values may be reversed, with or without corresponding modifications of gates and logic, without affecting the overall operation of the ADC.

Embodiments of calibrated ADC stages have been described where the artificial-noise insertion is accomplished by subtracting artificial-noise samples from the residual voltage $V_{in} - V_{DAC}$. As would be appreciated by a person of ordinary skill in the art, corresponding modifications would be made to the corresponding calibration circuit to account for the polarity reversal of the artificial-noise samples.

It will be further understood that various changes in the details, materials, and arrangements of the parts which have been described and illustrated in order to explain the nature of this invention may be made by those skilled in the art without departing from the scope of the invention as expressed in the following claims.

Signals and corresponding signal paths may be referred to by the same label and are interchangeable for purposes here.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A pipelined analog-to-digital converter (ADC) that converts an analog input voltage signal $V_{in}$ into a digital output value $D_{out}$, the ADC comprising a sequence of stages including at least a first calibrated stage comprising:
   an ADC sub-module that receives the analog input voltage signal $V_{in}$ and provides an ADC sub-module digital output value based on the analog input voltage signal $V_{in}$;
   a digital-to-analog converter (DAC) sub-module that receives the ADC sub-module digital output value and outputs a corresponding analog voltage signal $V_{DAC}$;
   a first difference module that generates an analog residual voltage signal based on a difference between the analog input voltage signal $V_{in}$ and the analog voltage signal $V_{DAC}$; and
   an artificial-noise-insertion module that inserts an analog artificial-noise voltage signal into the residual voltage signal to generate an analog combined voltage signal, wherein:
   the analog combined voltage signal can be used to calibrate the first calibrated stage; and
   the artificial-noise-insertion module generates the polarity of the artificial-noise voltage signal based on the polarity of the corresponding residual voltage signal.

2. The ADC of claim 1, wherein:
   the first calibrated stage further comprises an amplifier having a nominal gain G, wherein the amplifier amplifies the combined voltage signal to generate an amplified voltage signal;
   the amplified voltage signal is output from the first calibrated stage and provided to the next stage of the sequence of stages; and
   the amplifier has an actual gain that is a product of (1) the nominal gain G and (2) 1+e, where e is an error factor.

3. The ADC of claim 1, wherein:
   the ADC sub-module comprises a first plurality of comparators having corresponding outputs;
   the first calibrated stage further comprises:
      a comparator module comprising a second plurality of comparators, each comparator connected to receive the analog input voltage signal $V_{in}$ and provide a corresponding output value; and
      an encoder that:
         receives (1) the output values of the first plurality of comparators in the ADC sub-module and (2) the output values of the second plurality of comparators in the comparator module; and
         provides an encoder output value based on the output values received from the first and second pluralities of comparators.

4. The ADC of claim 3, wherein:
   reference voltage $V_{ref}$ is a maximum expected voltage for the analog input voltage signal $V_{in}$;
   the first plurality of comparators compare the analog input voltage signal $V_{in}$ to $-V_{ref}/4$ and $V_{ref}/4$; and
   the second plurality of comparators compare the analog input voltage signal $V_{in}$ to $-V_{ref}/2$, 0, and $V_{ref}/2$.

5. The ADC of claim 3, wherein the encoder output value indicates the polarity of the residual voltage signal.

6. The ADC of claim 3, wherein:
   the ADC sub-module has a resolution r; and
   the number of comparators c in the comparator module is $c=2^{(r+0.5)}-1$.

7. The ADC of claim 3, wherein the artificial-noise-insertion module comprises:
   a random-number (RN) generator that:
      receives the encoder output value;
      generates a random-like sequence of values; and
      generates an RN-generator output value based on a corresponding value of the random-like sequence of values and the encoder output value;
   a calibration DAC that generates the analog artificial-noise voltage signal based on the RN-generator output value and a scalar voltage level S; and
   a combining module that inserts the analog artificial-noise voltage signal into the residual voltage signal to generate the combined voltage signal.

8. The ADC of claim 7, wherein:
   each value of the random-like sequence of values generated by the RN generator is used to determine an alternating two-value sequence of desired polarities for a product of the values of (1) the received encoder output and (2) the output of the RN generator; and
   the RN-generator output value is generated to achieve the corresponding desired polarity for the product of the values of (1) the corresponding received encoder output and (2) the RN-generator output value.

9. The ADC of claim 8, wherein:
   if a value of the random-like sequence of values is zero, then the corresponding alternating two-value sequence of desired polarities is positive and then negative; and
   if a value of the random-like sequence of values is one, then the corresponding alternative two-value sequence of desired polarities is negative and then positive.

10. The ADC of claim 8, wherein:
    if a value of the random-like sequence of values is zero, then the corresponding alternating two-value sequence of desired polarities is negative and then positive; and
    if a value of the random-like sequence of values is one, then the corresponding alternative two-value sequence of desired polarities is positive and then negative.

11. The ADC of claim 8, wherein:
    if the desired polarity is positive and the corresponding encoder output value has a positive polarity, then the output value of the RN generator has a positive polarity;
    if the desired polarity is positive and the corresponding encoder output value has a negative polarity, then the output value of the RN generator has a negative polarity;
    if the desired polarity is negative and the corresponding encoder output value has a positive polarity, then the output value of the RN generator has a negative polarity; and if the desired polarity is negative and the corresponding encoder output value has a negative polarity, then the output of the RN generator has a positive polarity.

12. The ADC of claim 1, further comprising a calibration and summation module adapted to:
receive the ADC sub-module output value as a first-stage output value;
receive one or more other-stage output values from the one or more other stages of the sequence;
process the first stage output value and the one or more other-stage output values to (1) determine gain error for the first calibrated stage and (2) cancel the inserted artificial-noise voltage signal.

13. The ADC of claim 12, wherein:
the sequence of stages comprises N consecutive stages;
the first-stage output value is delayed in the calibration and summation module by N−1 clock cycles;
each of the one or more other-stage output values is delayed in the calibration and summation module by up to N−2 clock cycles.

14. The ADC of claim 13, wherein the calibration and summation module comprises, for the first calibrated stage:
a first calibration circuit that (a) receives (1) a summation value corresponding to the one or more other stages and (2) a scalar value, (b) performs the determination of error parameters for the first calibrated stage and cancellation of the inserted artificial-noise voltage signal, and (c) generates a calibration-circuit output value;
an amplifier that receives the calibration-circuit output value and output a modulated calibration-circuit output value; and
a summation module that combines the modulated calibration-circuit output value with the delayed first-stage output value to generate the digital output value $D_{out}$.

15. The ADC of claim 1, wherein the sequence of stages includes a second calibrated stage, wherein the second calibrated stage is calibrated before the first calibrated stage is calibrated.

16. A method for calibrating a pipelined analog-to-digital converter (ADC) that converts an analog input voltage signal $V_{in}$ into a digital output value $D_{out}$ and comprises a sequence of stages including at least a first calibrated stage comprising an ADC sub-module, a digital-to-analog converter (DAC) sub-module, a first difference module, and an artificial-noise-insertion module, the method comprising:
receiving, by the ADC sub-module, the analog input voltage signal $V_{in}$ and providing an sub-module digital output value based on the analog input voltage signal $V_{in}$;
receiving, by the digital-to-analog converter (DAC) sub-module, the ADC sub-module digital output value and outputting a corresponding analog voltage signal $V_{DAC}$;
generating, by the first difference module, an analog residual voltage signal based on a difference between the analog input voltage signal $V_{in}$ and the analog voltage signal $V_{DAC}$; and
inserting, by the artificial-noise-insertion module, an analog artificial-noise voltage signal into the residual voltage signal to generate an analog combined voltage signal, wherein:
the analog combined voltage signal is used to calibrate the first calibrated stage; and
the artificial-noise-insertion module generates the polarity of the artificial-noise voltage signal based on the polarity of the corresponding residual voltage signal.

17. The method of claim 16, further comprising:
amplifying, by an amplifier having a nominal gain G, the combined voltage signal to generate an amplified voltage signal, wherein the actual gain of the amplifier is the product of (1) the nominal gain G and (2) 1+e, where e is an error factor; and
outputting, by the first calibrated stage, the amplified voltage signal for provision to the next stage of the sequence of stages.

18. The method of claim 16, wherein:
the ADC sub-module comprises a first plurality of comparators having corresponding outputs;
the first calibrated stage further comprises:
a comparator module comprising a second plurality of comparators, each comparator adapted to receive the analog input voltage signal $V_{in}$ and provide a corresponding output value; and
an encoder; and
the method further comprises:
receiving, by the encoder, (1) the output values of the first plurality of comparators from the ADC sub-module and (2) the output values of the second plurality of comparators from the comparator module; and
providing, by the encoder, an encoder output value based on the output values received from the first and second pluralities of comparators.

19. The method of claim 18, wherein the encoder output value indicates the polarity of the first residual voltage signal.

20. The method of claim 18, wherein:
the artificial-noise-insertion module comprises a random-number (RN) generator, a calibration DAC, and a combining module; and
the method further comprises:
receiving, by the RN generator, the encoder output value, and generating a random-like sequence of values;
generating, by the RN generator, an RN generator output value based on a corresponding value of the random-like sequence of values and the encoder output value;
generating, by the calibration DAC, the analog artificial-noise voltage signal based on the RN-generator output value and a scalar voltage level S; and
inserting, by the combining module, the analog artificial-noise voltage signal into the residual-voltage signal to generate the combined voltage signal.

* * * * *